(12) United States Patent
Shitomi et al.

(10) Patent No.: US 9,082,716 B2
(45) Date of Patent: Jul. 14, 2015

(54) METHOD OF MANUFACTURING SEMICONDUCTOR DEVICE

(71) Applicant: Mitsubishi Electric Corporation, Tokyo (JP)

(72) Inventors: Takuichiro Shitomi, Tokyo (JP); Yusuke Kawase, Tokyo (JP); Junichi Yamashita, Tokyo (JP); Manabu Yoshino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/245,304

(22) Filed: Apr. 4, 2014

(65) Prior Publication Data

US 2015/0031208 A1    Jan. 29, 2015

(30) Foreign Application Priority Data

Jul. 25, 2013    (JP) .................... 2013-154667

(51) Int. Cl.
*H01L 21/336* (2006.01)
*H01L 21/308* (2006.01)
*H01L 21/306* (2006.01)

(52) U.S. Cl.
CPC ........ *H01L 21/308* (2013.01); *H01L 21/30604* (2013.01)

(58) Field of Classification Search
CPC .............. H01L 21/0228; H01L 21/762; H01L 21/02126; H01L 21/02389; H01L 21/76224

USPC ......... 438/270, 745, 680, 296, 311, 753, 297; 257/E21.006, E21.17, E21.267, 257/E21.305, E21.32, E21.229, E21.545, 257/E21.546

See application file for complete search history.

(56) References Cited

U.S. PATENT DOCUMENTS

| 7,598,539 | B2 * | 10/2009 | Wilhelm | ................ | 257/197 |
| 7,645,666 | B2 * | 1/2010 | Wilhelm | ................ | 438/235 |
| 8,048,734 | B2 * | 11/2011 | Wilhelm | ................ | 438/234 |
| 2008/0296623 | A1 * | 12/2008 | Wilhelm | ................ | 257/197 |
| 2010/0062578 | A1 * | 3/2010 | Wilhelm | ................ | 438/312 |

FOREIGN PATENT DOCUMENTS

| JP | 10-173041 A | 6/1998 |
| JP | 2008-244019 A | 10/2008 |

* cited by examiner

*Primary Examiner* — David Nhu
(74) *Attorney, Agent, or Firm* — Studebaker & Brackett PC

(57) ABSTRACT

A method of manufacturing a semiconductor device, includes the steps of forming a top surface nitride film on a top surface of a substrate and a bottom surface nitride film on a bottom surface of the substrate, forming a protective film on the top surface nitride film, removing the bottom surface nitride film by wet etching while the top surface nitride film is being protected by the protective film, removing the protective film after the removing of the bottom surface nitride film, patterning the top surface nitride film so as to form an opening in the top surface nitride film, and forming a second oxide film on the bottom surface of the substrate while forming a first oxide film on a surface portion of the substrate which is exposed by the opening.

8 Claims, 2 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device whereby a thermally oxidized film having a relatively large thickness is removed from or formed on primarily an SOI wafer. For example, the method is used to remove an oxide film mask for forming a well or used to form a LOCOS oxide film, etc.

2. Background Art

Japanese Laid-Open Patent Publication No. H10-173041 discloses a technique in which a trench isolation semiconductor substrate with polysilicon-filled trenches is formed in such a manner as to minimize warping of the substrate. Specifically, when filling the trenches of the substrate with polysilicon, this prior art technique also forms a polysilicon film on a silicon oxide film formed on the bottom surface of the substrate so that the silicon oxide film is protected by the polysilicon film.

If a substrate with a large amount of warpage is used to manufacture a semiconductor device, the substrate may suffer from various process failures such as exposure failure in photolithography, suction attachment failure to the stage, and transfer failure on the manufacturing line. For example, if a thick oxide film such as a LOCOS oxide film is formed only on the top surface side of a substrate, the substrate tends to warp. Further, a thick oxide film mask used, e.g., for forming a well in a substrate tends to cause the substrate to warp.

SUMMARY OF THE INVENTION

The present invention has been made to solve the above problems. It is, therefore, an object of the present invention to provide a method of manufacturing a semiconductor device which is capable of minimizing warping of the substrate of the semiconductor device.

The features and advantages of the present invention may be summarized as follows.

According to one aspect of the present invention, a method of manufacturing a semiconductor device, includes the steps of forming a top surface nitride film on a top surface of a substrate and a bottom surface nitride film on a bottom surface of the substrate, forming a protective film on the top surface nitride film, removing the bottom surface nitride film by wet etching while the top surface nitride film is being protected by the protective film, removing the protective film after the removing of the bottom surface nitride film, patterning the top surface nitride film so as to form an opening in the top surface nitride film, and forming a second oxide film on the bottom surface of the substrate while forming a first oxide film on a surface portion of the substrate which is exposed by the opening.

According to another aspect of the present invention, a method of manufacturing a semiconductor device, includes the steps of forming a top surface nitride film on a top surface of a substrate, patterning the top surface nitride film so as to form an opening in the top surface nitride film, and forming a second oxide film on a bottom surface of the substrate while forming a first oxide film on a surface portion of the substrate which is exposed by the opening.

According to another aspect of the present invention, a method of manufacturing a semiconductor device, includes the steps of forming a bottom surface polysilicon on a bottom surface of a substrate having a top surface oxide film formed on a top surface thereof, the top surface oxide film being exposed on a top surface side of the substrate, the bottom surface polysilicon being exposed on a bottom surface side of the substrate, and removing the exposed top surface oxide film by wet etching while leaving the exposed bottom surface polysilicon intact, wherein the substrate has a buried oxide film on the top surface side thereof and a bottom surface oxide film on the bottom surface side thereof.

Other and further objects, features and advantages of the invention will appear more fully from the following description.

DETAILED DESCRIPTION OF THE PREFERRED EMBODIMENTS

Figure 1A:
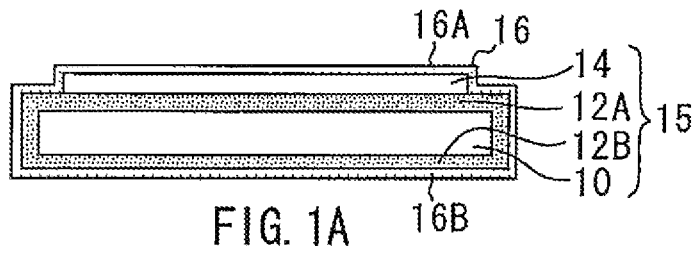
FIGS. 1A-1F are cross-sectional views of partially completed semiconductor devices, showing a method of manufacturing a semiconductor device in accordance with a first embodiment of the present invention.

Methods of manufacturing a semiconductor device in accordance with embodiments of the present invention will be described with reference to the accompanying drawings. Throughout the specification the same or corresponding components are designated by the same reference numerals and may be described only once.

First Embodiment

FIG. 1 includes FIGS. 1A to 1F, which are cross-sectional views of partially completed semiconductor devices, showing a method of manufacturing a semiconductor device in accordance with a first embodiment of the present invention. The semiconductor device manufacturing method of the first embodiment relates to a method for forming an oxide film by thermal oxidation, e.g., in a LOCOS (local oxidation of silicon) oxide film formation process. First, a nitride film 16 is formed on a substrate 15. FIG. 1A is a cross-sectional view of the substrate 15 with the nitride film 16 formed thereon. It should be noted that the substrates of this and subsequent embodiments described herein are SOI (silicon on insulator) wafers. The substrate 15 includes a support substrate 10 which is a silicon (Si) single crystal wafer. A buried oxide film 12A is formed on the top surface of the support substrate 10. A bottom surface oxide film 12B is formed on the bottom surface of the support substrate 10. The buried oxide film 12A and the bottom surface oxide film 12B have a thickness of, e.g., 2 µm or more.

An SOI layer 14 is formed on the surface of the buried oxide film 12A. The SOI layer 14 is a Si layer formed on the buried oxide film 12A. Semiconductor elements are later formed in the SOI layer 14. Thus, the substrate 15 is made up of the support substrate 10, the buried oxide film 12A, the bottom surface oxide film 12B, and the SOI layer 14. The substrate 15 is, e.g., a wafer having a diameter of 8 inches or more. Such substrates (having an SOI layer) are primarily used to manufacture a high voltage power device or a micro-electro-mechanical system (MEMS).

As described above, the manufacturing method of the first embodiment forms the nitride film 16 on the substrate 15 in the first step. The nitride film 16 includes a top surface nitride film 16A formed on the top surface of the substrate 15 and a bottom surface nitride film 16B formed on the bottom surface of the substrate 15. It should be noted that the nitride film 16 is formed, e.g., in a batch process by CVD.

Figure 1B:
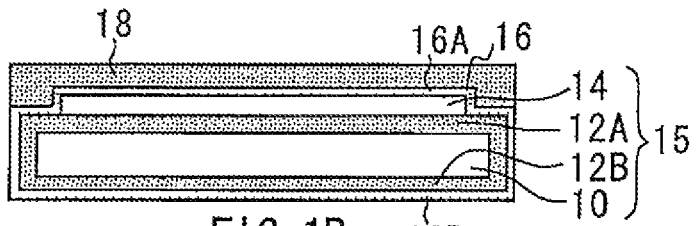

A protective film 18 is then formed. FIG. 1B is a cross-sectional view of the partially completed semiconductor device shown in FIG. 1A after the protective film 18 has been formed on the top surface nitride film 16A. The protective film 18 is preferably formed by CVD or some other suitable means which enables the film to be formed only on the top surface side of the substrate 15. The protective film 18 is, e.g., an oxide film. Next, the bottom surface nitride film 16B is removed.

Figure 1C:
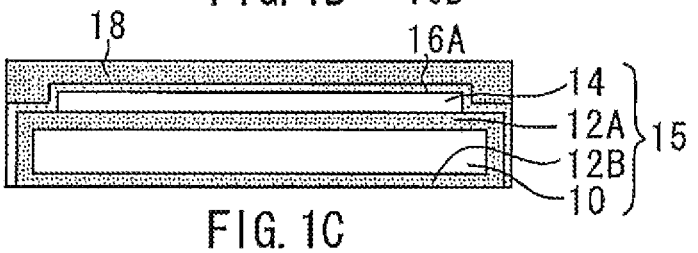
Figure 1D:
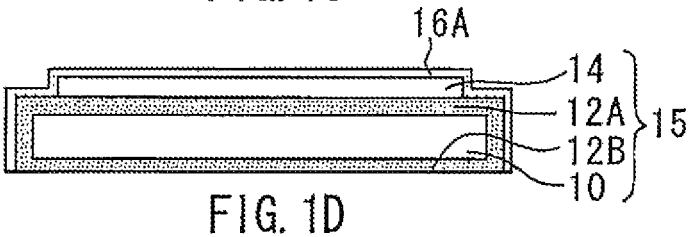

FIG. 1C is a cross-sectional view of the partially completed semiconductor device shown in FIG. 1B after the bottom surface nitride film 16B has been removed. Specifically in this step, the bottom surface nitride film 16B is removed by wet etching while the top surface nitride film 16A is being protected by the protective film 18. Next, the protective film 18 is removed. FIG. 1D is a cross-sectional view of the partially completed semiconductor device shown in FIG. 1C after the protective film 18 has been removed.

Figure 1E:
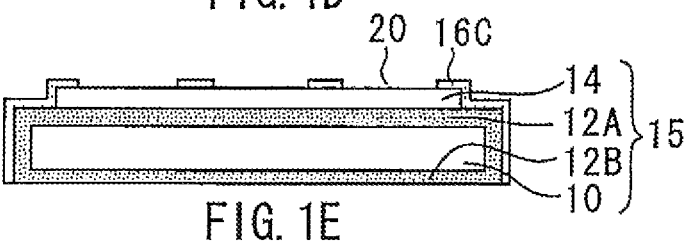

The top surface nitride film 16A is then patterned. FIG. 1E is a cross-sectional view of the partially completed semiconductor device shown in FIG. 1D after the top surface nitride film 16A has been patterned into a top surface nitride film 16C. The patterning of the top surface nitride film 16A into the top surface nitride film 16C is accomplished by known photolithographic and etching techniques. The top surface nitride film 16C has openings 20 therein.

Figure 1F:
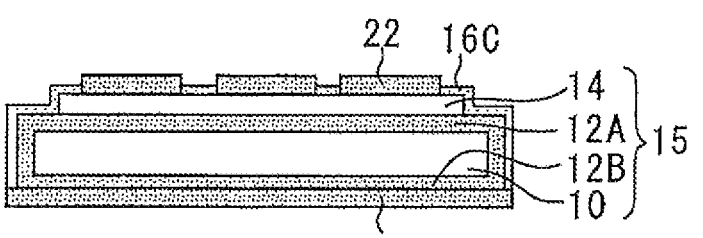

Next, oxide films are formed by thermal oxidation. FIG. 1F is a cross-sectional view of the partially completed semiconductor device shown in FIG. 1E after the oxide films have been formed. Specifically in this step, a second oxide film 24 is formed on the bottom surface of the substrate 15 while first oxide films 22 are formed on the surface portions of the substrate 15 exposed by the openings of the top surface nitride film 16C. The first oxide films 22 are LOCOS oxide films having a thickness of, e.g., 1000 nm or more.

The first oxide films 22 (which are LOCOS oxide films) are thick oxide films. If such a thick oxide film or films are formed only on the top surface of the substrate 15, then the stress on the top surface side and the stress on the bottom surface side of the substrate 15 will become unbalanced, resulting in warping of the substrate 15. The method of manufacturing a semiconductor device in accordance with the first embodiment avoids this problem. Specifically, in this method, the bottom surface nitride film 16B is removed before forming the first oxide films 22, thereby exposing the bottom surface oxide film 12B on the bottom surface of the substrate 15. The thick oxide film 24 is then formed on the exposed bottom surface oxide film 12B while the first oxide films 22 are formed on the top surface of the substrate 15. This ensures that the stresses on the top and bottom surface sides of the substrate 15 are balanced, making it possible to minimize warping of the substrate 15. Further, the removal of the bottom surface nitride film 16B results in a decrease in the stress in the substrate 15.

In a practical experiment, a LOCOS oxide film having a thickness of 1650 nm was formed on each of a plurality of 8 inch wafers by the method of the first embodiment (wherein a thick second oxide film, such as the second oxide film 24, was formed on the bottom surface of each wafer), and the amounts of warping of these wafers were measured. The results are summarized as follows: the maximum amount of warping was 134 μm, the minimum amount of warping was 124 μm, and the average amount of warping was 129 μm.

Further, in another practical experiment, a LOCOS oxide film was formed on each of another plurality of 8 inch wafers by a conventional method (i.e., without forming a thick second oxide film on the bottom surface of each wafer), and the amounts of warping of these wafers were measured. The results are summarized as follows: the maximum amount of warping was 209 μm, the minimum amount of warping was 196 μm, and the average amount of warping was 203 μm. As can be seen from these results, the method of the present embodiment can be used to form a thick oxide film, such as a LOCOS oxide film, on the top surface of a substrate without causing substantial warping of the substrate, as compared to prior art methods.

Although in the first embodiment the protective film 18 is an oxide film, it is to be understood that in other embodiments the protective film may be a resist. Further, although in the first embodiment the bottom surface nitride film 16B is formed on the bottom surface of the substrate 15 when forming the top surface nitride film 16A on the top surface of the substrate 15, it is to be understood that in other embodiments the formation of the bottom surface nitride film 16B may be omitted. This also eliminates the need for the steps of forming the protective film 18, removing the bottom surface nitride film 16B, and removing the protective film 18. In such cases, the top surface nitride film 16A is formed in a one-wafer-at-a-time process.

Although in the first embodiment the substrate 15 is made up of the support substrate 10, the buried oxide film 12A, the bottom surface oxide film 12B, and the SOI layer 14, it is to be understood that in other embodiments the substrate 15 may be a Si substrate (i.e., a Si bulk substrate or epi substrate).

The substrate 15 may be made up of an SOI layer and a support substrate bonded together. Here let it be assumed that the top surface and the bottom surface of the support substrate are covered with a top surface oxide film and a bottom surface oxide film, respectively, which have a thickness of 0.8 μm, and let it be further assumed that the bottom surface of the SOI layer is covered with a bottom surface oxide film having a thickness of 0.2 μm. In such a case, the combination of the top surface oxide film of the support substrate and the bottom surface oxide film of the SOI layer corresponds to the buried oxide film 12A described above and has a thickness of 1 μm, and the bottom surface oxide film of the support substrate corresponds to the bottom surface oxide film 12B described above and has a thickness of 0.8 μm, which is 0.2 μm less than the combined thickness of the top surface oxide film of the support substrate and the bottom surface oxide film of the SOI layer.

Therefore, when the substrate 15 is such a substrate (made up of an SOI layer and a support substrate bonded together), the stress on the top surface side of the substrate 15 is initially greater than the stress on the bottom surface side of the substrate 15. In order to compensate for this unbalance, the first oxide films 22 and the second oxide film 24 described above in connection with the semiconductor device manufacturing method of the first embodiment may be formed on the substrate 15 in such a manner that the surface area of the second oxide film 24 is greater than the combined surface area of the first oxide films 22, thereby ensuring that the stresses on the top and bottom surface sides of the substrate 15 are balanced.

Although the substrate 15 has been described as having a diameter of 8 inches or more, it is to be understood that it may have a diameter of less than 8 inches. It should be noted that the larger the diameter of a substrate, the more likely it is that the substrate will warp. This means that the semiconductor device manufacturing method of the first embodiment may provide a greater advantage when applied to a substrate having a larger diameter. Further, the substrate is not limited to any particular material. The first oxide film may not be a LOCOS oxide film and may have any suitable thickness.

Second Embodiment

Figure 2A:
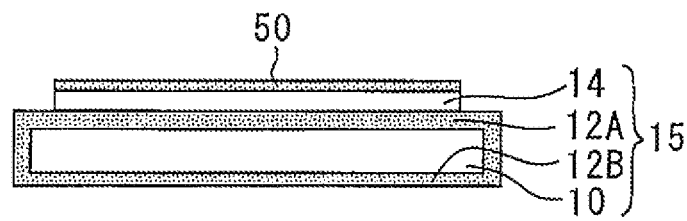
FIGS. 2A-2D are cross-sectional views of partially completed semiconductor devices, showing a method of manufacturing a semiconductor device in accordance with a second embodiment of the present invention.

FIG. 2 includes FIGS. 2A to 2D, which are cross-sectional views of partially completed semiconductor devices, showing a method of manufacturing a semiconductor device in accordance with a second embodiment of the present invention. The substrate 15 shown in these figures is similar to the substrate 15 of the first embodiment. FIG. 2A is a cross-sectional view of the substrate 15 with a top surface oxide film 50 formed thereon. The top surface oxide film 50 is an oxide film which has a thickness of 200 nm or more and which is used as a mask in a well formation process.

Figure 2B:
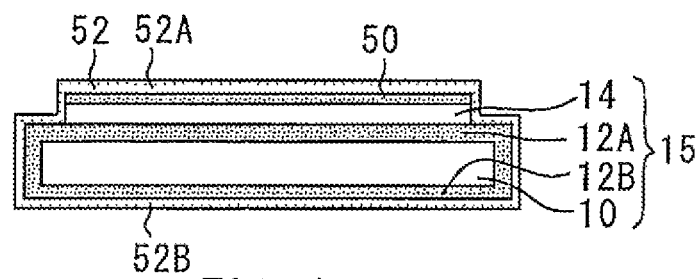

The semiconductor device manufacturing method of the second embodiment relates to a method for removing the top surface oxide film 50 after it has been used as a mask, e.g., in a well formation process. First, a polysilicon 52 is formed on the substrate 15. FIG. 2B is a cross-sectional view of the substrate 15 after the polysilicon 52 has been formed on the top and bottom surface sides of the substrate 15. The polysilicon 52 is formed, e.g., in a batch process by CVD. The polysilicon 52 includes a top surface polysilicon 52A formed on the top surface of the top surface oxide film 50 and a bottom surface polysilicon 52B formed on the bottom surface oxide film 12B on bottom surface of the substrate 15.

Figure 2C:
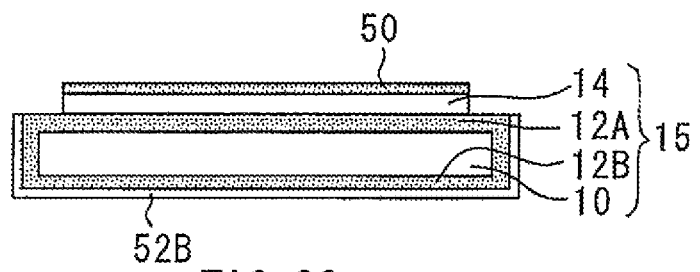

Next, the entire top surface polysilicon 52A is removed. FIG. 2C is a cross-sectional view of the substrate 15 after the top surface polysilicon 52A has been removed from the top surface of the substrate. Specifically, the top surface polysilicon 52A is removed, e.g., by dry etching. The top surface oxide film 50 is then removed.

Figure 2D:
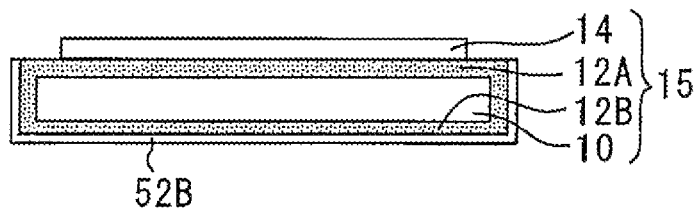

FIG. 2D is a cross-sectional view of the substrate 15 after the top surface oxide film 50 has been removed from the top surface of the substrate. Specifically in this step, the exposed top surface oxide film 50 is removed from the top surface of the substrate 15 by wet etching while leaving the exposed bottom surface polysilicon 52B intact on the bottom surface side of the substrate 15.

In the method of manufacturing a semiconductor device in accordance with the second embodiment, the top surface oxide film 50 is wet etched while the bottom surface oxide film 12B is being protected by the bottom surface polysilicon 52B, thus leaving the bottom surface oxide film 12B intact. This ensures that the stresses on the top and bottom surface sides of the substrate (or wafer) 15 are balanced, making it possible to minimize warping of the substrate 15. It should be noted that in order to facilitate the removal of the top surface polysilicon 52A of the polysilicon 52, the polysilicon 52 preferably has the smallest thickness that still allows the bottom surface polysilicon 52B of the polysilicon 52 to function as a wet etch stopper.

In a practical experiment, a plurality of 8 inch wafers having a 250 nm thick oxide film mask (or top surface oxide film) formed thereon were prepared, and the amounts of warping of these wafers were measured after the oxide film mask was removed from each wafer by the method of the second embodiment (wherein a bottom surface polysilicon, such as the bottom surface polysilicon 52B, was formed on the bottom surface of the wafer.) The results are summarized as follows: the maximum amount of warping was 18 μm, the minimum amount of warping was 14 μm, and the average amount of warping was 16 μm. In another practical experiment, another plurality of 8 inch wafers having a 250 nm thick oxide film mask (or top surface oxide film) formed thereon were prepared, and the amounts of warping of these wafers were measured after the oxide film mask was removed from each wafer by a conventional method (i.e., without forming a bottom surface polysilicon, such as the bottom surface polysilicon 52B, on the bottom surface of the wafer). The results are summarized as follows: the maximum amount of warping was 100 μm, the minimum amount of warping was 96 μm, and the average amount of warping was 98 μm. As can be seen from these results, the method of the second embodiment can be used to remove a top surface oxide film from a substrate without causing substantial warping of the substrate, as compared to prior art methods.

Although in the second embodiment the bottom surface oxide film 12B is covered and protected by polysilicon, it is to be understood that in other embodiments the bottom surface oxide film 12B may be covered and protected by any suitable material to which the top surface oxide film 50 can be sufficiently selectively etched.

Further, although in the second embodiment the top surface polysilicon 52A is formed on the top side of the substrate 15 when forming the bottom surface polysilicon 52B on the bottom side of the substrate 15, it is to be understood that in other embodiments the formation of the top surface polysilicon 52A may be omitted, thereby also eliminating the need for the step of removing the top surface polysilicon 52A. In such cases, the bottom surface polysilicon 52B is formed in a one-wafer-at-a-time process. It should be noted that in that process the top surface oxide film 50 may be inflicted with fine flaws during the deposition of polysilicon on the bottom surface of the substrate. This, however, presents no problem, since the top surface oxide film 50 is later removed.

The values for parameters, such as thicknesses, given in the description of the first and second embodiments are only by way of example. The method of manufacturing a semiconductor device in accordance with the second embodiment is susceptible of alterations similar to those described in connection with the first embodiment.

Thus the present invention enables a semiconductor device to be manufactured in such a manner as to minimize warping of its substrate.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-154667, filed on Jul. 25, 2013 including specification, claims, drawings and summary, on which the Convention priority of the present application is based, is incorporated herein by reference in its entirety.

What is claimed is:

1. A method of manufacturing a semiconductor device, comprising:
    forming a top surface nitride film on a top surface of a substrate and a bottom surface nitride film on a bottom surface of said substrate;
    forming a protective film on said top surface nitride film;
    removing said bottom surface nitride film by wet etching while said top surface nitride film is being protected by said protective film;
    removing said protective film after said removing of said bottom surface nitride film;
    patterning said top surface nitride film so as to form an opening in said top surface nitride film; and forming a second oxide film on said bottom surface of said substrate while forming a first oxide film on a surface portion of said substrate which is exposed by said opening.

2. A method of manufacturing a semiconductor device, comprising:
   forming a top surface nitride film on a top surface of a substrate;
   patterning said top surface nitride film so as to form an opening in said top surface nitride film; and
   forming a second oxide film on a bottom surface of said substrate while forming a first oxide film on a surface portion of said substrate which is exposed by said opening.

3. The method according to claim 1, wherein said first oxide film is a LOCOS oxide film having a thickness of 1000 nm or more.

4. The method according to claim 1, wherein:
   said substrate includes a support substrate, a buried oxide film formed on a top surface of said support substrate, a bottom surface oxide film formed on a bottom surface of said support substrate, and an SOI layer formed on a surface of said buried oxide film; and
   said buried oxide film and said bottom surface oxide film have a thickness of 2 μm or more.

5. The method according to claim 1, wherein said substrate is a Si substrate.

6. A method of manufacturing a semiconductor device, comprising:
   forming a bottom surface polysilicon on a bottom surface of a substrate having a top surface oxide film formed on a top surface thereof, said top surface oxide film being exposed on a top surface side of said substrate, said bottom surface polysilicon being exposed on a bottom surface side of said substrate; and
   removing said exposed top surface oxide film by wet etching while leaving said exposed bottom surface polysilicon intact;
   wherein said substrate has a buried oxide film on said top surface side thereof and a bottom surface oxide film on said bottom surface side thereof.

7. The method according to claim 6, wherein said top surface oxide film is an oxide film which has a thickness of 200 nm or more and which is used as a mask in a well formation process.

8. The method according to claim 1, wherein said substrate is a wafer having a diameter of 8 inches or more.

* * * * *